(12) United States Patent
Lakshmanan et al.

(10) Patent No.: US 9,157,151 B2
(45) Date of Patent: Oct. 13, 2015

(54) ELIMINATION OF FIRST WAFER EFFECT FOR PECVD FILMS

(75) Inventors: Annamalai Lakshmanan, Santa Clara, CA (US); Ganesh Balasubramanian, Sunnyvale, CA (US); Francimar Schmitt, Santa Clara, CA (US); Bok Hoen Kim, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1860 days.

(21) Appl. No.: 11/756,358

(22) Filed: May 31, 2007

(65) Prior Publication Data
US 2007/0281083 A1    Dec. 6, 2007

Related U.S. Application Data

(60) Provisional application No. 60/810,974, filed on Jun. 5, 2006.

(51) Int. Cl.
| | | |
|---|---|---|
| H05H 1/02 | (2006.01) | |
| H05H 1/24 | (2006.01) | |
| C23C 16/44 | (2006.01) | |
| C23C 16/40 | (2006.01) | |
| H01J 37/32 | (2006.01) | |

(52) U.S. Cl.
CPC ........... *C23C 16/4405* (2013.01); *C23C 16/401* (2013.01); *H01J 37/32357* (2013.01); *H01J 37/32862* (2013.01)

(58) Field of Classification Search
CPC .............. C23C 16/4404; C23C 16/401; C23C 16/4405; C23C 16/505; H01J 37/32357; H01J 37/32862

USPC ........... 427/570, 230, 237, 248.1, 249.1, 569, 427/574; 438/758
See application file for complete search history.

(56) References Cited

U.S. PATENT DOCUMENTS

| | | | |
|---|---|---|---|
| 5,855,681 A | | 1/1999 | Maydan et al. |
| 5,925,212 A | * | 7/1999 | Rice et al. ................ 156/345.27 |
| 6,117,245 A | * | 9/2000 | Mandrekar et al. .......... 118/724 |
| 6,364,954 B2 | | 4/2002 | Umotoy et al. |
| 6,392,350 B1 | | 5/2002 | Amano |

(Continued)

FOREIGN PATENT DOCUMENTS

| | | |
|---|---|---|
| CN | 1 407604 | 4/2003 |
| JP | 2001-127068 | 5/2001 |

(Continued)

OTHER PUBLICATIONS

Office Action dated Jul. 11, 2008 for Korean Patent Application No. 10-2007-54441.

(Continued)

*Primary Examiner* — Nadine Norton
*Assistant Examiner* — Christopher Remavege
(74) *Attorney, Agent, or Firm* — Patterson & Sheridan, LLP (57) ABSTRACT

The present invention generally provides an apparatus and method for eliminating the "first wafer effect" for plasma enhanced chemical vapor deposition (PECVD). One embodiment of the present invention provides a method for preparing a chamber after the chamber being idle for a period of time. The method comprises a cleaning step followed by a season step and a heating step adapted to the length of the idle time.

19 Claims, 3 Drawing Sheets

(56) References Cited

U.S. PATENT DOCUMENTS

| | | |
|---|---|---|
| 6,767,402 B2 | 7/2004 | Takamatsu et al. |
| 6,797,643 B2 | 9/2004 | Rocha-Alvarez et al. |
| 6,878,206 B2 | 4/2005 | Tzu et al. |
| 6,905,940 B2 | 6/2005 | Ingle et al. |
| 7,231,321 B2* | 6/2007 | Furuya et al. ............ 702/185 |
| 7,582,182 B2* | 9/2009 | Matsumoto et al. ..... 156/345.24 |
| 2003/0010355 A1 | 1/2003 | Nowak et al. |
| 2003/0111007 A1* | 6/2003 | Takamatsu et al. ............ 117/86 |
| 2004/0009617 A1* | 1/2004 | Masuda et al. ................. 438/5 |
| 2004/0045577 A1* | 3/2004 | Ji et al. ........................ 134/1.1 |
| 2004/0253378 A1 | 12/2004 | Schmitt et al. |
| 2004/0263827 A1 | 12/2004 | Xu et al. |
| 2005/0003088 A1* | 1/2005 | Park et al. ................. 427/248.1 |
| 2005/0095859 A1 | 5/2005 | Chen et al. |
| 2005/0126709 A1* | 6/2005 | Takayama et al. ....... 156/345.25 |
| 2005/0221020 A1* | 10/2005 | Fukiage ..................... 427/569 |
| 2005/0227499 A1 | 10/2005 | Park et al. |
| 2005/0250340 A1* | 11/2005 | Chen et al. ................. 438/758 |
| 2005/0263072 A1 | 12/2005 | Balasubramanian et al. |
| 2005/0263248 A1 | 12/2005 | Rocha-Alvarez et al. |
| 2005/0284574 A1* | 12/2005 | Tanaka et al. ........... 156/345.33 |
| 2006/0027165 A1 | 2/2006 | Sen et al. |
| 2007/0281478 A1* | 12/2007 | Ikegami et al. .............. 438/689 |

FOREIGN PATENT DOCUMENTS

| | | |
|---|---|---|
| JP | 2003-158122 | 5/2003 |
| KR | 2001-0053278 | 6/2001 |

OTHER PUBLICATIONS

Office Action for Chinese Patent Application No. 200710110433.2 dated Apr. 3, 2009.

* cited by examiner

ELIMINATION OF FIRST WAFER EFFECT FOR PECVD FILMS

CROSS-REFERENCE TO RELATED APPLICATIONS

This application claims priority to U.S. Provisional Patent Application Ser. No. 60/810,974, filed Jun. 5, 2006, which incorporated herein by reference.

BACKGROUND OF THE INVENTION

1. Field of the Invention

Embodiments of the present invention generally relate to an apparatus and method for depositing thin films on semiconductor substrates using chemical vapor deposition (CVD). More particularly, embodiments of the present invention relate to an apparatus and method for eliminating the "first wafer effect" for plasma enhanced chemical vapor deposition (PECVD).

2. Description of the Related Art

Semiconductor fabrication includes a series of processes used to fabricate multilayered features on semiconductor substrates. The process chambers may include, for example, substrate preconditioning chambers, cleaning chambers, bake chambers, chill chambers, chemical vapor deposition chambers, physical vapor deposition chambers, etch chambers, electrochemical plating chambers, and the like. Successful operation requires a stream of substrates to be processed among the chambers, which conducts steady state performance on each one of the stream of substrates.

During semiconductor fabrication, materials, such as oxides, e.g., carbon doped oxides, are typically deposited on a substrate in a processing chamber, such as a deposition chamber, e.g., a chemical vapor deposition (CVD) chamber. In a typical CVD process, a substrate is exposed to one or more volatile precursors flown into the CVD chamber, which react and/or decompose on the substrate surface to produce the desired deposit. Frequently, volatile by-products are also produced, and are removed by gas flow through the CVD chamber. In a plasma enhanced chemical vapor deposition (PEVCD), a plasma is generated in the CVD chamber to enhance chemical reaction rates of the precursors. PECVD processing allows deposition at lower temperatures, which is often critical in the manufacture of semiconductors. A steady state performance of a CVD or PECVD chamber generally requires all the hardware components, such as, for example, the liquid flow meter for controlling the flow rate, the faceplate for generating the plasma within the chamber, and the pedestal for supporting and heating the substrate, to render ideal performance. However, after an extended idle time, a CVD chamber may need to successively perform deposition and cleaning processes on several substrates before it reaches the steady state performance. As a result, the deposited film properties on the first several substrates are significantly different from ideal, which is often referred as the "first wafer effect". Sometimes, it needs to process up to 12 substrates before reaching the steady state.

The "first wafer effect" may be attributed to several reasons. The faceplate, which generally has a radio frequency (RF) feedthrough providing a bias potential to generate a plasma, has a temperature much lower for the first substrates that leads to a lower deposition rate. Additionally, after a long idle time, the liquid flow meter (LFM) calibration factor can vary up to 5%, which leads to unsteady precursor supply rate during the first substrates. Further, the faceplate may also be non-uniformly heated which causes non-uniform deposition across the substrate surface.

In the state of the art system, the "first wafer effect" is reduced by implementation of a "Go-Clean" process prior to processing the first substrate after a period of idle time. The state of the art "Go-Clean" process generally includes a plasma heating step, a deposition step, a clean step and a season step. The state of the art "Go-Clean" process reduces the "first wafer effect", but typically process 4 to 6 substrates after the "Go-Clean" before reaching the steady state.

Therefore, there is a need to develop an apparatus and method that minimize or eliminate the "first wafer effect" in CVD process.

SUMMARY OF THE INVENTION

The present invention generally provides an apparatus and method for eliminating the "first wafer effect" for plasma enhanced chemical vapor deposition (PECVD).

One embodiment of the present invention provides a method for preparing a chamber after the chamber being idle for a period of time. The method comprises cleaning the chamber using a first active species, seasoning the chamber by delivering a first gas mixture while applying radio frequency power to the first gas mixture, and heating the chamber by delivering a heating gas while applying radio frequency power to the heating gas.

Another embodiment of the present invention provides a method for preparing a chamber after a period of idle time. The method comprises delivering an active species generated from a remote plasma source to the chamber, delivering a gas mixture to the chamber while applying radio frequency power to the gas mixture, wherein the gas mixture comprises a precursor gas, an oxidizing gas, and a carrier gas, and delivering a heating gas to the chamber.

Yet another embodiment of the present invention provides a method for depositing a film on a substrate in a chamber. The method comprises cleaning the chamber by delivering an active species to the chamber, seasoning the chamber by delivering a first gas mixture comprising a first precursor to the chamber while applying radio frequency power to the first gas mixture, heating the chamber by delivering a heating gas while applying radio frequency power to the heating gas, and deposition the film on the substrate by delivering a second gas mixture comprising the first precursor to the chamber while applying radio frequency power to the second gas mixture.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention generally provides an apparatus and method that eliminate the "first wafer effect". A new "Start up" sequence for PECVD is developed. The new "Start up" sequence comprises a cleaning step, a season step and heating step adapted to length of the idle time. The new "Start up" sequence requires shorter time and less energy. Additionally, the present invention provides apparatus and method to attain steady state performance for liquid flow meter. The combination of the new "Start up" sequence and attaining steady state for LFM of the present invention greatly reduces or even eliminates the "first wafer effect".

The invention is illustratively described below in reference to modification of a PRODUCER® SE CVD system or a DXZ® CVD system, both commercially available from Applied Materials, Inc., Santa Clara, Calif. The Producer® SE CVD system (e.g., 200 mm or 300 mm) has two isolated processing regions that may be used to deposit carbon-doped silicon oxides and other materials and is described in U.S. Pat. No. 5,855,681 and No. 6,495,233, which are incorporated by reference herein. The DXZ® CVD chamber is disclosed in U.S. Pat. No. 6,364,954, issued Apr. 2, 2002, which is incorporated herein by reference.

Figure 1:
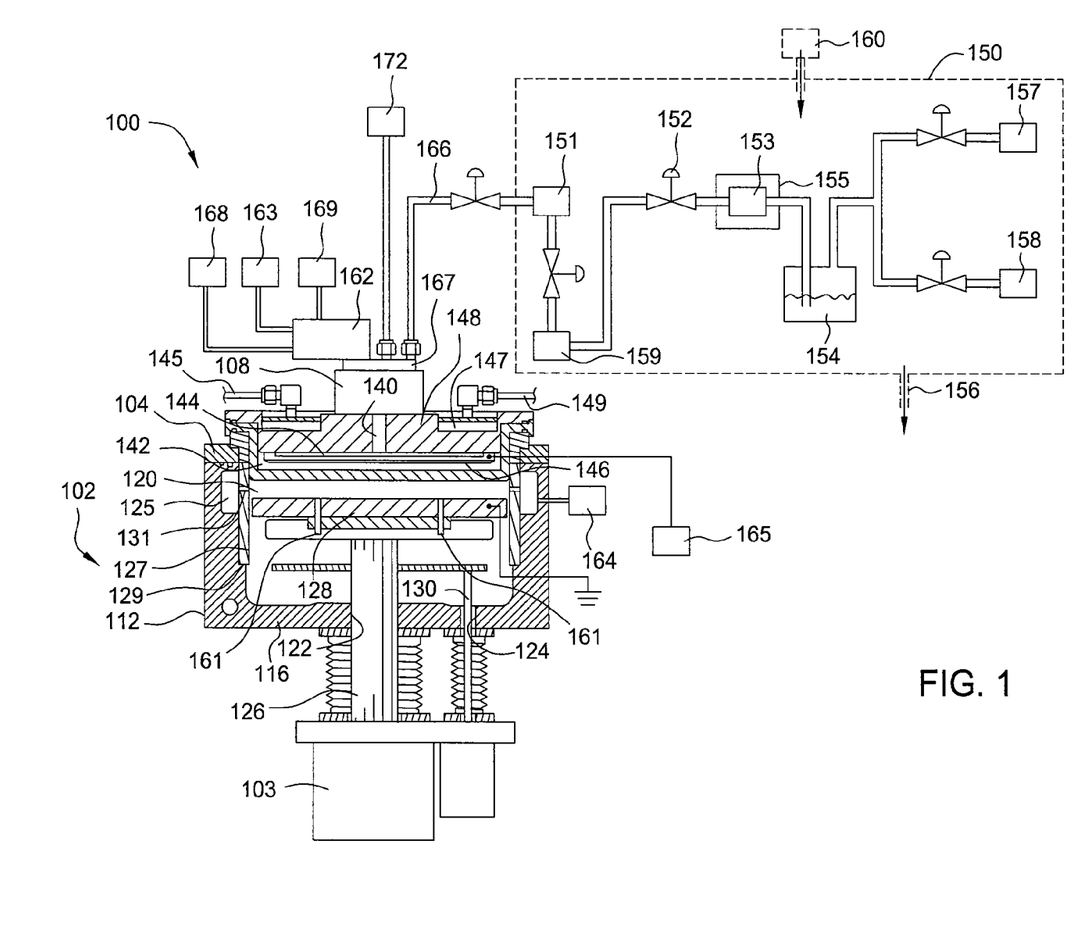
FIG. 1 illustrates a PECVD system in accordance with one embodiment of the present invention.

FIG. 1 illustrates a cross sectional view of a PECVD system 100 in accordance with one embodiment of the present invention. The PECVD system 100 generally comprises a chamber body 102 supporting a chamber lid 104 which may be attached to the chamber body 102 by a hinge. The chamber body 102 comprises sidewalls 112 and a bottom wall 115 defining a processing region 120. The chamber lid 104 may comprise one or more gas distribution systems 108 disposed therethrough for delivering reactant and cleaning gases into the processing region 120. A circumferential pumping channel 125 formed in the sidewalls 112 and coupled to a pumping system 164 is configured for exhausting gases from the processing region 120 and controlling the pressure within the processing region 120. Two passages 122 and 124 are formed in the bottom wall 116. A stem 126 of a heater pedestal 128 for supporting and heating a substrate being processed passes through the passage 122. A rod 130 configured to activate substrate lift pins 161 passes through the passage 124.

The heater pedestal 128 is movably disposed in the processing region 120 driven by a drive system 103 coupled to the stem 126. The heater pedestal 128 may comprise heating elements, for example resistive elements, to heat a substrate positioned thereon to a desired process temperature. Alternatively, the heater pedestal 128 may be heated by an outside heating element such as a lamp assembly. The drive system 103 may include linear actuators, or a motor and reduction gearing assembly, to lower or raise the heater pedestal 128 within the processing region 120.

A chamber liner 127, preferably made of ceramic or the like, is disposed in the processing region 120 to protect the sidewalls 112 from the corrosive processing environment. The chamber liner 127 may be supported by a ledge 129 formed in the sidewalls 112. A plurality of exhaust ports 131 may be formed on the chamber liner 127. The plurality of exhaust ports 131 is configured to connect the processing region 120 to the circumferential pumping channel 125.

The gas distribution assembly 108 configured to deliver reactant and cleaning gases is disposed through the chamber lid 104 to deliver gases into the processing region 120. The gas distribution assembly 108 includes a gas inlet passage 140 which delivers gas into a shower head assembly 142. The showerhead assembly 142 is comprised of an annular base plate 148 having a blocker plate 144 disposed intermediate to a faceplate 146. An RF (radio frequency) source 165 coupled to the shower head assembly 142 provides a bias potential to the shower head assembly 142 to facilitate generation of a plasma between the faceplate 146 of the shower head assembly 142 and the heater pedestal 128. The RF source 165 generally comprises a high frequency radio frequency (HFRF) power source, e.g., a 13.56 MHz RF generator, and a low frequency radio frequency (LFRF) power source, e.g., a 300 kHz RF generator. The LFRF power source provides both low frequency generation and fixed match elements. The HFRF power source is designed for use with a fixed match and regulates the power delivered to the load, eliminating concerns about forward and reflected power.

A cooling channel 147 is formed in the annular base plate 148 of the gas distribution system 108 to cool the annular base plate 148 during operation. A cooling inlet 145 delivers a coolant fluid, such as water or the like, into the cooling channel 147. The coolant fluid exits the cooling channel 147 through a coolant outlet 149.

The chamber lid 104 further comprises matching passages to deliver gases from one or more gas inlets 166 and a remote plasma source 162 to a gas inlet manifold 167 positioned on top of the chamber lid 104.

A cleaning step in a new "Start up" sequence is generally preformed using a plasma generated from a remote plasma source positioned near a processing chamber, such as the remote plasma source 162. The remote plasma source 162 is configured to supply activated species to the processing region 120 to remove deposited materials from the interior surfaces. The remote plasma source 162 is generally connected to a precursor source 163, a carrier gas source 168 and a power source 169. During operation, a precursor gas flows into the remote plasma source 162 from the precursor source 163 at a desired flow rate. The power source 169 provides a radio frequency or microwave power to activate the precursor gas in the remote plasma source 162 to form an active species which is then flown into the processing region 120 through the gas inlet manifold 167 and the gas distribution assembly 108. A carrier gas, such as argon, nitrogen, helium, hydrogen or oxygen, etc, may be flown to the remote plasma source 162 and to the processing region 120 to aid the transportation of the activated species and/or to assist in the cleaning process, or help initiating and/or stabilizing the plasma in the processing region 120. In one embodiment, the power source 169 provides a radio frequency power of a wide range, e.g., 400 KHz to 13.56 MHz). The reactive gas may be selected from a wide range of options, including the commonly used halogens and halogen compounds. For example, the reactive gas may be chlorine, fluorine or compounds thereof, e.g. $NF_3$, $CF_4$, $SF_6$, $C_2F_6$, $CCl_4$, $C_2Cl_6$, etc, depending one the deposited material to be removed. The remote plasma source 162 is generally positioned close to the processing region 120 because radicals are usually short lived.

One or more processing gases may be delivered to the processing region 120 via the gas inlet manifold 167. Typically, there are three methods to form a gas or vapor from a precursor to be delivered to a processing region of a processing chamber to deposit a layer of desired material on a substrate. The first method is a sublimation process in which the precursor in a solid form is vaporized using a controlled process which allows the precursor to change phase from a solid to a gas (or vapor) in an ampoule. The second method is to generate a gas of a precursor by an evaporation process, in which a carrier gas is bubbled through a temperature controlled liquid precursor and the carrier gas carries away the precursor gas. In the third method, a precursor gas is generated in a liquid delivery system in which a liquid precursor is delivered to a vaporizer, in which the liquid precursor changes state from a liquid to a gas by additional energy transferred to the vaporizer. A PECVD system generally comprises one or more precursor delivery systems.

FIG. 1 schematically illustrates a liquid delivery gas source 150 having a liquid flow meter 153 which may be effect by the idle time of the system. The liquid delivery gas source 150 generally includes an ampoule gas source 157 and a liquid source 158 connected to an ampoule 154. The liquid source 158 provides liquid precursor to the ampoule 154. The ampoule gas source 157 provides gas to the ampoule 154 to pump the liquid precursor in the ampoule 154 to the liquid flow meter 153 which measures the amount of precursor flowing through. The liquid flow meter 153 may be used to determine the flow rate of the precursor gas supplied to the processing region 120 during process. In one embodiment, the liquid flow meter 153 may be a metering pump. In one embodiment, a thermal shield 155 may be disposed around the liquid flow meter 153. The thermal shield 155 serves as a heat barrier for the liquid flow meter 153 to stabilize the ambient temperature of the liquid flow meter 153. The liquid precursor flows from the liquid flow meter 153 to a vaporizer 159 which vaporizes the liquid precursor in a precursor gas and transfers the precursor gas to a vessel 151. The vessel 151 is connected to the gas inlet manifold 167 through a gas inlet 166. The liquid delivery gas source 150 generally operates in a closed environment wherein a circulation gas, such as nitrogen, may be flown through constantly to maintain a controlled temperature and to reduce the risk of gas leak. As shown in FIG. 1, a circulation gas may flow into the liquid delivery gas source 150 from a circulation gas source 160 and exits the liquid delivery gas source from an exhaust 156.

The PECVD system 100 may further comprise one or more gas sources 172 configured to provide a carrier gas and/or a precursor gas.

The PECVD system 100 may be configured to deposit different films on a substrate, e.g., a carbon doped silicon oxide film from octamethylcyclotetrasiloxane (OMCTS), a carbon doped silicon oxide film from trimethylsilane (TMS), a silicon oxide film deposited from tetraethoxysilane (TEOS), a silicon oxide film from silane ($SiH_4$), a carbon doped silicon oxide film from diethoxymethylsilane and alpha-terpinene, and a silicon carbide film.

When a PECVD system, such as the PECVD system 100 of FIG. 1, has been idled for a while, a new "Start up" sequence of the present invention may be performed to the PECVD system to minimize or eliminate the "first wafer effect" so that the PECVD system reaches a steady state for the first substrate being processed after the idle period.

Figure 2:
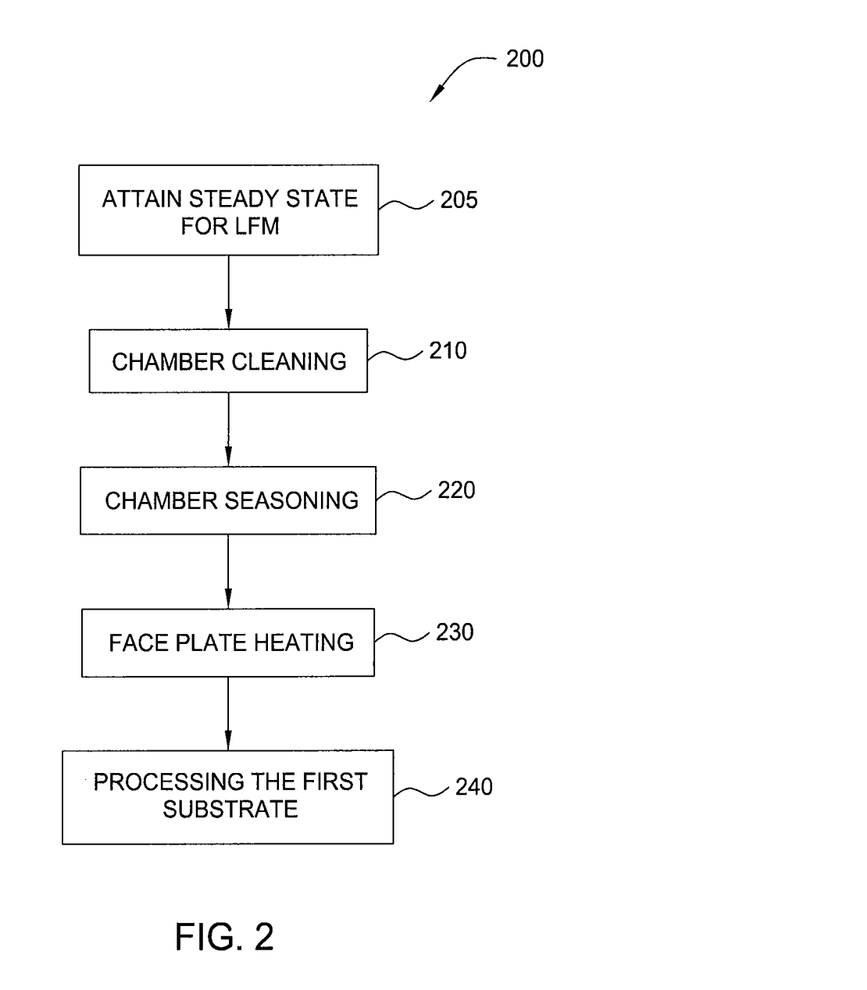
FIG. 2 illustrates a "Start up" process in accordance with one embodiment of the present invention.

FIG. 2 illustrates a "Start up" process 200 in accordance with one embodiment of the present invention. The "Start up" process 200 generally comprises step 205, in which the steady state of liquid flow meters is to be attained. Step 205 is followed by step 210 in which a chamber cleaning process is performed. Step 210 is followed by step 220 in which a chamber seasoning process is performed. The step 220 is followed by step 230 in which the faceplate is to be heated. After step 230, the chamber will reach the steady state and a first substrate may be processed in step 240. Steps 205, 210, 220 and 230 will be discussed in detail.

In step 205, the steady state of liquid flow meters is to be attained. The performance of liquid flow meters, such as the liquid flow meter 153 of FIG. 1, is affected by the ambient temperature. The ambient temperature may be affected by components around the liquid flow meter, such as liquid injection valves and heater jackets for liquid injection valves, which generate heat and radiate heat to the liquid flow meter. After a long period of idle time, components around the liquid flow meter cool down from their steady state temperature, which causes the liquid flow meter to work in a reduced temperature. As a result, the liquid flow meter's calibration factor can vary causing non-accurate measurement of liquid precursor.

In one embodiment, the steady state of an idle liquid flow meter may be achieved by flowing a liquid precursor through the liquid flow meter for a given amount of time. This process is called "seasoning the liquid flow meter". The given amount of time may be determined by the process being run and the size of the liquid flow meter. Generally, it takes longer time to bring a larger liquid flow meter to steady state. For a liquid flow meter measuring OMCTS for a deposition process performed at about 150° C., the given amount of time is between about 2 minutes to about 5 minutes.

Additionally, a thermal shield, such as the thermal shield 155 of FIG. 1, may be disposed to stabilize the steady state of a liquid flow meter. Furthermore, maintaining exhaust pressure for around a liquid flow meter may prevent temperature fluctuation and facilitate steady state performance of the liquid flow meter. In one embodiment, the exhaust pressure, e.g., pressure in the exhaust 156, may be maintained at a value to prevent temperature fluctuation near the liquid flow meter. In one embodiment, the exhaust pressure may be maintained at greater than about 0.5 inches of water.

In step 210, a chamber cleaning process is performed to clean surface inside the chamber. The previous deposition and/or seasoning typically result in deposition of some of the material on the chamber walls and components of the deposition chamber. The material deposited on the chamber walls and components can affect deposition rate from substrate to substrate and the uniformity of the deposition on one substrate. The material deposited on the chamber walls and components can also detach from the chamber walls and components and create contamination particles that can damage or destroy semiconductor device. A CVD chamber is periodically cleaned using a cleaning gas to reduce the effect of materials deposited on the chamber and components. It is also beneficial to perform a chamber cleaning process after a period of idle time to remove contamination and improve substrate to substrate or within substrate uniformity.

In one embodiment, the cleaning process may be performed by flowing a cleaning gas excited in a remote plasma source to the chamber. The cleaning gas may be a halogen containing compound selected based on its ability to bind the precursor gases used in the deposition process and the deposited material formed on the chamber walls and components. The excited cleaning gas generally forms volatile products with the precursor gases and the deposited materials and then be exhausted out of the chamber. In one embodiment, the cleaning gas is $NF_3$. The choice of the cleaning gas may be decided according to cleaning requirement. Other cleaning gases that may be used include $F_2$, $CF_4$, $C_3F_8$, $SF_6$, $C_2F_6$, $CCl_4$ and $C_2Cl_6$. The cleaning time may be decided by the thickness of the deposited material to be removed. In one embodiment, the cleaning time in this cleaning process may be decided by the season time and thickness of the deposition process performed before the idle time.

In step 220, a chamber seasoning process is performed. A seasoning process generally comprises depositing a seasoning film to coat the interior surfaces defining the processing region in a chamber in accordance with the subsequent deposition process recipe. In the present invention, a seasoning process is carried out after the cleaning by-products of step 210 have been exhausted out of the chamber. The seasoning process is to deposit a film onto components on the chamber to seal remaining contaminates therein and to reduce the contamination level during the subsequent process. Additionally, the seasoning film provides protection to the chamber interior surface from the damage that may be done by the following plasma heat up process. When a plasma heat up process, such as helium heat up, is performed on a heater pedestal (such as the heater pedestal 128 of FIG. 1) without a seasoning film, the plasma would sputter AIF from the heater pedestal to a faceplate (such as the faceplate 146 of FIG. 1) forming a dark residue that is known to cause uniformity drift and in-film particle issues.

In one embodiment, the seasoning film may be deposited on the chamber interior surface using gas mixtures identical to the gas mixtures used in the deposition processes performed in the chamber after the seasoning process. During the seasoning process, a precursor gas, an oxidation gas and a carrier gas may be flown into the chamber where a radio frequency source provides radio frequency energy to activate the precursor gas and enables a deposition. A detailed description of a seasoning may be found in the U.S. patent application Ser. No. 10/816,606, filed on Apr. 2, 2004, published on Oct. 13, 2005 as United States Patent Application Publication No: US 2005/0227499, entitled "Oxide-like Seasoning for Dielectric Low K Films", which is incorporated herein as reference.

In step 230, a heating process is performed to the faceplate in the chamber. During a PEVCD, a plasma for depositing a film is generated between the faceplate, such as the faceplate 146 of FIG. 1, and the heater pedestal, such as the heater pedestal 128 of FIG. 1. The temperature of the faceplate affects deposition thickness and uniformity. Therefore, it is necessary to bring the faceplate to its steady state temperature to eliminate or reduce the "first wafer effect". The temperature of the faceplate drops while the chamber is in an idle state. After an extended idle time, the faceplate may cool down. A heating process may be taken to heat the faceplate and bring it to steady state. In one embodiment, the heating process may be performed by applying a plasma to the chamber. The plasma may be generated by supplying a suitable gas, such as helium, argon, nitrogen, oxygen or the combination thereof, to the chamber and apply a radio frequency energy to the gas.

The degree of temperature drop during idle of a PECVD chamber generally relates to the length of the idle time. The heating time of the present invention adapts to the length of idle time avoiding over heating or under heating. Additionally, due to the faceplate geometry, the temperature profile across the faceplate is not uniform at steady state. In fact, at steady state, the edge of the faceplate has a lower temperature than the center of the faceplate. For example, in a process to deposition a CARBON DOPED SILICON OXIDE film from octamethylcyclotetrasiloxane (OMCTS), the edge of the faceplate may have a temperature of about 90° C. and the center of the faceplate may have a temperature of about 150° C. at steady state. During deposition process, the steady state of the faceplate is obtained by depositing substrates in a steady stream which includes alternately running a plasma enhanced deposition which heats the chamber and a purge/cleaning process which cools the chamber. In one embodiment of the present invention, the heating process may be performed by running a plasma heating and purge process to mimic the heat-cool effect in the successive deposition.

Figure 3:
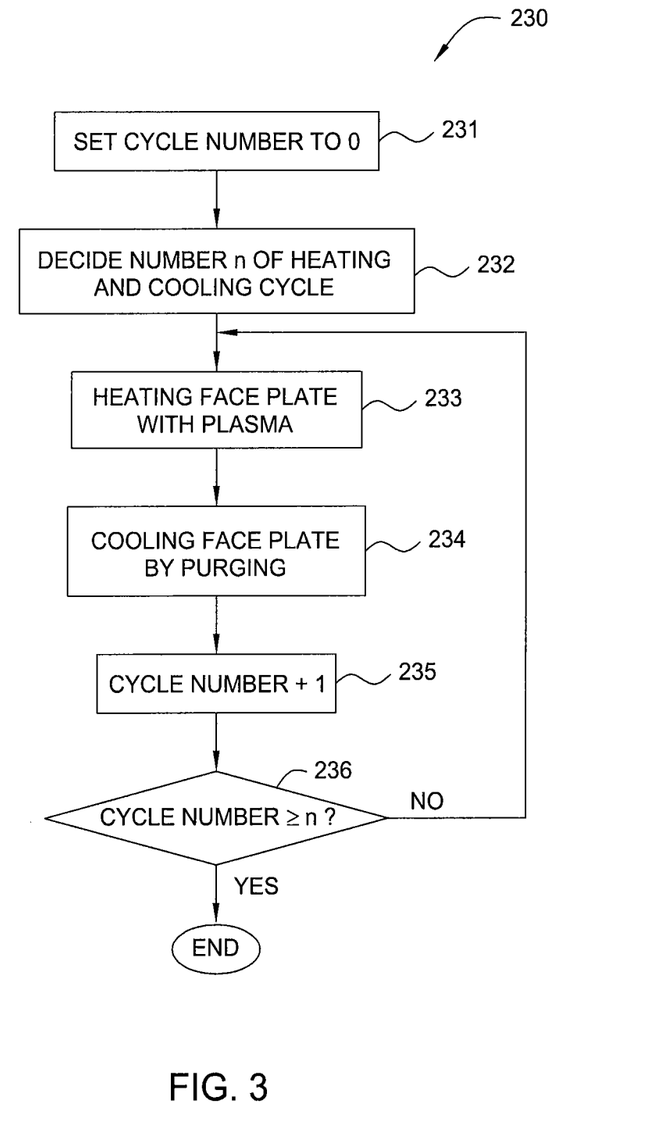
FIG. 3 illustrates a method for heating a faceplate in accordance with one embodiment of the present invention.

FIG. 3 illustrates one embodiment of the step 230 in accordance with one embodiment of the present invention. The step 230 adapts to the length of the idle time and the heat-cool effect during deposition.

In step 231, the number n of heating and cooling cycle needed to bring the faceplate to steady state is decided according to the length of idle time.

In step 232, the cycle counter i is set to zero.

In step 233, a heating process is performed to the faceplate. In one embodiment, the heating process may be performed by flowing a heating gas, such as helium, to the chamber and generating an in-situ plasma from the heating gas to heat the faceplate.

In step 234, a cooling process is performed by purging the chamber. In one embodiment, the purging process may be performed by simply turning off the radio frequency source and keeping the heating gas flowing through.

In step 235, the cycle counter i is increased by one.

In step 236, the cycle counter i is compared to the number n of heating and cooling cycle needed. If the cycle counter i is smaller than the number n, steps 233, 234 and 235 will be repeated. If the cycle counter i is not smaller than the number n, the process is ended.

The "Start up" sequence of the present invention may be applied in applicable PECVD processing chambers. The "Start up" sequence is suitable for eliminating or reducing the "first wafer effect" during deposition of different films on a substrate, e.g., a carbon doped silicon oxide film from octamethylcyclotetrasiloxane (OMCTS), a carbon doped silicon oxide film from trimethylsilane (TMS), a silicon oxide film deposited from tetraethoxysilane (TEOS), a silicon oxide film from silane ($SiH_4$), a carbon doped silicon oxide film from diethoxymethylsilane and alpha-terpinene, and a silicon carbide film.

EXAMPLE

A "Start up" sequence of the present invention is performed for a PECVD deposition process for depositing a carbon doped silicon oxide film from octamethylcyclotetrasiloxane (OMCTS) using a PRODUCER® SE twin chamber, which comprises two processing chambers similar to the PECVD system 100 of FIG. 1. The detailed description of the PRODUCER® SE twin chamber may be found in U.S. Pat. No. 5,855,681 and No. 6,495,233, which are incorporated by reference herein. The carbon doped silicon oxide film is to be deposited on substrates at a chamber temperature of about 150° C.

Seasoning the Liquid Flow Meter

After the chamber being idle for a period of time, the OMCTS is flown through the system with radio frequency sources turned off for about at least 2 minutes. More particularly, OMCTS is flown through the system for about 2 minutes to about 5 minutes.

Cleaning the Chamber

A cleaning process is performed to the chamber. The cleaning time is about 3 times as long as the seasoning time. In this example, the OMCTS season before idle is about 10 seconds long. The cleaning time is about 30 seconds. The cleaning process is performed at about 6 Torr and a chamber temperature of 350° C. The remote plasma source is turned on to generate a remote plasma. The spacing between the faceplate and the heater pedestal is about 200 mils. The flowing processing gases and flow rate are used:

NF3, at 1350 sccm for both chambers (675 sccm for each chamber);

Helium, at 9000 sccm for both chambers (4500 sccm for each chamber).

Seasoning the Chamber

A seasoning layer is deposited on the interior surface of the chamber at about 5 Torr and a chamber temperature of 350° C. The spacing between the faceplate and the heater pedestal is from about 300 mils to about 500 mils. The seasoning time is 10 seconds. A low frequency radio frequency (LFRF) power source of 300 kHz is turned on at about 120 Watts to about 200

Watts. A high radio frequency radio frequency (HFRF) power source of 13.56 MHz is turned on at about 700 Watts to about 1000 Watts. The HFRF power source is turned on about 0.5 seconds after the LFRF power source is turned on. The flowing processing gases and flow rate are used:

OMCTS, at 900 sccm for both chambers (450 sccm for each chamber);

Oxygen, at 900 sccm for both chambers (450 sccm for each chamber);

Helium, at 1000 sccm for both chambers (500 sccm for each chamber).

Heating the Faceplate

Three cycles of helium heating and helium purge is performed to the chamber.

The helium heating is performed at about 3-6 Torr and a chamber temperature of 350° C. The spacing between the faceplate and the heater pedestal is about 200 mils. The heating time is about 30 seconds. The high radio frequency radio frequency (HFRF) power source of 13.56 MHz is turned on at about 1000 Watts. The flowing processing gases and flow rate are used:

Helium, at 1500 sccm for both chambers (750 sccm for each chamber).

The helium purging is performed at about 3-6 Torr and a chamber temperature of 350° C. The spacing between the faceplate and the heater pedestal is about 200 mils. The purging time is about 10 seconds. The high radio frequency radio frequency (HFRF) power source is turned off. The flowing processing gases and flow rate are used:

Helium, at 1500 sccm for both chambers (750 sccm for each chamber).

The total time for the "Start up" sequence in this example excluding the liquid flow meter seasoning is about 160 seconds. The "first wafer effect" is eliminated in the subsequent carbon doped silicon oxide film deposition from octamethylcyclotetrasiloxane (OMCTS).

While the foregoing is directed to embodiments of the present invention, other and further embodiments of the invention may be devised without departing from the basic scope thereof, and the scope thereof is determined by the claims that follow.

The invention claimed is:

1. A method for preparing a chamber after the chamber being idle for a period of time, comprising:
   prior to introducing a substrate into the chamber, seasoning a liquid flow meter by flowing a liquid precursor through the liquid flow meter with radio frequency power turned off for a given period of time;
   cleaning the chamber using a first active species;
   seasoning the chamber by delivering a first gas mixture while applying radio frequency power to the first gas mixture; and
   after seasoning the chamber and prior to introduction of the substrate, stabilizing at least a portion of a showerhead assembly within the chamber by alternately heating and cooling at least the portion of the showerhead assembly.

2. The method of claim 1, wherein the alternately heating and cooling at least the portion of the showerhead assembly comprises:
   repeating delivering a heating gas to at least the portion of the showerhead assembly with radio frequency power and delivering the heating gas to at least the portion of the showerhead assembly without radio frequency power.

3. The method of claim 2, wherein the heating gas comprises helium, argon, nitrogen, oxygen, or a combination thereof.

4. The method of claim 1, wherein the first active species is generated using a remote plasma source.

5. A method for depositing a film on a substrate in a chamber, comprising:
   prior to introducing a substrate into the chamber, seasoning a liquid flow meter by flowing a first precursor through the liquid flow meter with radio frequency power turned off for a given period of time;
   cleaning the chamber by delivering an active species to the chamber;
   seasoning the chamber by delivering a first gas mixture comprising the first precursor to the chamber while applying radio frequency power to the first gas mixture;
   after seasoning the chamber, heating at least a portion of a showerhead assembly by delivering a heating gas to at least the portion of the showerhead assembly while applying radio frequency power to the heating gas;
   cooling at least the portion of the showerhead assembly by delivering the heating gas to at least the portion of the showerhead assembly without applying radio frequency power to the heating gas; and
   introducing the substrate into the chamber and then depositing a film on the substrate by delivering a second gas mixture comprising the first precursor to the chamber while applying radio frequency power to the second gas mixture.

6. The method of claim 5, wherein the active species is generated from a halogen containing gas.

7. The method of claim 1, wherein the liquid precursor comprises octamethylcyclotetrasiloxane (OMCTS).

8. The method of claim 1, wherein the liquid precursor is flown through the liquid flow meter for about 2 minutes to about 5 minutes.

9. The method of claim 5, wherein the first precursor comprises octamethylcyclotetrasiloxane (OMCTS).

10. The method of claim 5, wherein the first precursor is flown through the liquid flow meter for about 2 minutes to about 5 minutes.

11. A method for depositing a film on a substrate in a chamber, the method is performed in a following sequence comprising:
    seasoning a liquid flow meter by flowing a first precursor through the liquid flow meter with radio frequency power turned off for a given period of time;
    cleaning the chamber by delivering an active species to the chamber;
    seasoning the chamber by delivering a first gas mixture comprising the first precursor to the chamber while applying radio frequency power to the first gas mixture to deposit a seasoning layer on an interior surface of the chamber;
    prior to introduction of the substrate, stabilizing at least a portion of a showerhead assembly within the chamber by delivering a heating gas to at least the portion of the showerhead assembly while periodically turning on and off radio frequency power applied to the heating gas; and
    depositing a film on the substrate by delivering a second gas mixture comprising the first precursor to the chamber while applying radio frequency power to the second gas mixture.

12. The method of claim 11, wherein seasoning the liquid flow meter is performed without the presence of the substrate.

13. The method of claim 1, wherein the portion of the showerhead assembly comprises a faceplate disposed opposite to a heater pedestal.

14. The method of claim 1, wherein the heating is performed for about 30 seconds and the cooling is performed for about 10 seconds.

15. The method of claim 5, wherein the heating gas comprises helium, argon, nitrogen, oxygen, or a combination thereof.

16. The method of claim 5, wherein the heating the at least the portion of the showerhead assembly is performed for about 30 seconds and the cooling the portion of the showerhead assembly is performed for about 10 seconds.

17. The method of claim 5, wherein the portion of the showerhead assembly comprises a faceplate disposed opposite to a heater pedestal.

18. The method of claim 11, wherein the portion of the showerhead assembly comprises a faceplate disposed opposite to a heater pedestal.

19. The method of claim 11, wherein the stabilizing the at least the portion of the showerhead assembly is performed for about 10 seconds to about 30 seconds.

* * * * *

UNITED STATES PATENT AND TRADEMARK OFFICE
CERTIFICATE OF CORRECTION

PATENT NO.        : 9,157,151 B2                                Page 1 of 1
APPLICATION NO.   : 11/756358
DATED             : October 13, 2015
INVENTOR(S)       : Lakshmanan et al.

It is certified that error appears in the above-identified patent and that said Letters Patent is hereby corrected as shown below:

In Specification:

In Detailed Description:

Column 4, Line 46, please delete "one" and insert -- on -- therefor;

Column 7, Line 5, please delete "AIF" and insert -- AlF -- therefor;

In Claims:

Column 11, Claim 16, Line 7, please delete "the" after heating;

Column 11, Claim 19, Line 17, please delete "the" after stabilizing.

Signed and Sealed this
First Day of March, 2016

Michelle K. Lee
*Director of the United States Patent and Trademark Office*